(12) United States Patent
Kasichainula

(10) Patent No.: US 7,655,324 B2
(45) Date of Patent: Feb. 2, 2010

(54) ELECTRO-MAGNETIC STORAGE DEVICE AND METHOD

(75) Inventor: Sridhar Kasichainula, 5258 Mill Creek La., San Jose, CA (US) 95136

(73) Assignee: Sridhar Kasichainula, San Jose, CA (US)

( * ) Notice: Subject to any disclaimer, the term of this patent is extended or adjusted under 35 U.S.C. 154(b) by 724 days.

(21) Appl. No.: 11/231,124

(22) Filed: Sep. 20, 2005

(65) Prior Publication Data

US 2007/0064349 A1    Mar. 22, 2007

(51) Int. Cl.
*B32B 15/04* (2006.01)
(52) U.S. Cl. ............... 428/693.1; 428/692.1; 428/826; 428/827
(58) Field of Classification Search .............. None
See application file for complete search history.

(56) References Cited

U.S. PATENT DOCUMENTS

| | | | |
|---|---|---|---|
| 4,636,600 A * | 1/1987 | Lipperts | ............... 218/129 |
| 5,835,396 A | 11/1998 | Zhang | |
| 6,034,882 A | 3/2000 | Johnson et al. | |
| 6,310,526 B1 | 10/2001 | Yip et al. | |
| 6,574,033 B1 | 6/2003 | Chui et al. | |
| 6,777,773 B2 | 8/2004 | Knall | |
| 2002/0153584 A1 * | 10/2002 | Frazier et al. | ............... 257/448 |
| 2004/0178460 A1 * | 9/2004 | Lee et al. | ............... 257/421 |

* cited by examiner

*Primary Examiner*—D. Lawrence Tarazano
*Assistant Examiner*—Gary D Harris
(74) *Attorney, Agent, or Firm*—Raj Abhyanker LLP

(57) ABSTRACT

An electro-magnetic storage device and method are disclosed. In one embodiment, a memory device includes a first magnetic material to attract a movable structure (e.g., a ferromagnetic material) when a first voltage is applied between the first magnetic material and the movable structure, and a second magnetic material to release the movable structure when a second voltage is applied between the second magnetic material and the movable structure. The movable arm may create a closed circuit when the second voltage is applied between the second magnetic material and the movable structure. There may be a vacuum-gap between the movable structure and at least one of the first magnetic material and/or the second magnetic material. The memory device may be stackable on other memory devices having similar properties, and/or electrically coupled with other memory devices having similar properties in a memory array.

16 Claims, 14 Drawing Sheets

ELECTRO-MAGNETIC STORAGE DEVICE AND METHOD

FIELD OF TECHNOLOGY

This disclosure relates generally to the technical fields of memory devices and, in one example embodiment, to an electro-magnetic storage device and method.

BACKGROUND

A storage device is a hardware device that holds data. There are two types of the storage device, a non-volatile storage device and a volatile storage device. The non-volatile storage device (e.g., a hard drive) may hold data even when power is turned off. The volatile storage device (e.g., a static random access memory (a SRAM), a dynamic random access memory (a DRAM), etc.) may lose data when power is turned off.

A transistor (e.g., a simple electronic switch, either preventing or allowing current to flow through) is a solid state semiconductor device which may be used in the storage device. A storage cell (e.g., a physical unit of the storage device that may store exactly one bit) may be created from a number of transistors arranged in such a way as to allow data to be at least temporarily stored. For example, each bit in the SRAM may be stored on four transistors that form two cross-coupled inverters. The storage cell in the SRAM may have two stable states which may used to denote 0 and 1. Two additional access transistors may serve to control access to the storage cell during read and write operations. Thus, it may take six transistors (e.g., CMOS SRAM) to store one memory bit in the storage device.

As application programs demand more storage space and as computing power becomes faster, there is an increasing demand for denser and quicker versions of the storage device. In addition, widespread acceptance and adoption of portable computing devices (e.g., laptop computers, personal digital assistants, etc.) have created a demand for versions of the storage device that use less power.

In order to meet this demand, engineers have reduced physical size of the storage cell to be able to achieve desired properties of lower power, faster speed, and/or higher density of the storage device. In recent years, it has become increasingly difficult to achieve higher densities in the storage device because of leakage (e.g., thinner gate oxides of the transistor may create larger interference between a source and a drain), geometry constraints (e.g., patterning smaller features of the storage cell on a wafer is increasingly difficult and may be expensive), mask step complexity (e.g., it may take nineteen or more mask steps to make each storage cell), and photolithography challenges (e.g., shorter wavelengths are difficult to achieve and may be needed to define smaller features of the storage cell).

SUMMARY

An electro-magnetic storage device and method are disclosed. In one aspect, a memory device includes a first magnetic material to attract a movable structure when a first voltage is applied between the first magnetic material and the movable structure; and a second magnetic material to release the movable structure when a second voltage is applied between the second magnetic material and the movable structure.

The memory device may be less than 0.1 micron by 0.1 micron in size, with a mean-time between failure of at least 10 years. The first magnetic material and the second magnetic material may be approximately between 50 to 100 Å (Angstroms) in thickness, and the memory device may be faster than 5 nanoseconds in speed. The movable structure may be made of a ferromagnetic material, such as a combination of one or more of iron, cobalt, nickel, and gadolinium. The ferromagnetic material may have a thickness between 5-20 nanometers and have a tensile strength of at least 100 megapascals (MPa).

There may be a vacuum (e.g., a vacuum gap, a vacuum chamber, etc.) between the movable structure and the first magnetic material and/or the second magnetic material. The movable arm may be attached to a dielectric film (e.g. of thickness 10 to 20 Å) between the movable arm and the first magnetic material when a first voltage is applied between the first magnetic material and the movable structure, and may create a closed circuit when the second voltage is applied between the second magnetic material and the movable structure.

Further, the movable arm may only detach (e.g. through an electrostatic force) from the dielectric film when the second voltage is applied between the second magnetic material and the movable structure. The electrostatic force may be greater than the magnetic strengths of the first and the second magnetic materials (which may be of equal magnetic strength).

In another aspect, a method includes magnetically adjusting a position of a ferromagnetic structure to alter a binary state of a memory device, and processing a command based on the binary state of the memory device. The memory device may be stackable on other memory devices having similar properties, and/or electrically coupled with other memory devices having similar properties in a memory array. Also, the method may be in a form of a machine-readable medium embodying a set of instructions that, when executed by a machine, cause the machine to perform any method disclosed herein.

In yet another aspect, a system includes processing a command associated with a memory device having at least one movable structure; and toggling a binary state of the memory device responsive to the movable structure of the memory device, and/or a means for achieving these operations. The movable structure may be made of a ferromagnetic material and may reposition through an electrostatic force when a voltage is applied between the movable structure and associated magnetic electrodes.

In yet another aspect, a structure assembly includes a first magnetic layer formed above a substrate; a first dielectric layer formed above the first magnetic layer; a set of one or more metal layers having at least one movable component that is encompassed by a vacuum and which is formed above the first dielectric layer; a second dielectric layer formed above the vacuum and above the set of one or more metal layers; and a second magnetic layer formed above the second dielectric layer. Each of the one or more movable components encompassed by the vacuum may be separated by a glass barrier and the vacuum may be between approximately 3000-6000 Å (Angstroms) in height.

Other features will be apparent from the accompanying drawings and from the detailed description that follows.

BRIEF DESCRIPTION OF THE DRAWINGS

Example embodiments of the present invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

An electro-magnetic storage device and method are disclosed. In the following description, for purposes of explanation, numerous specific details are set forth in order to provide a thorough understanding of the various embodiments. It will be evident, however, to one skilled in the art that the various embodiments may be practiced without these specific details. An example embodiment provides methods and systems for a memory device including a first magnetic material to attract a movable structure when a first voltage is applied between the first magnetic material and the movable structure; and a second magnetic material to release the movable structure when a second voltage is applied between the second magnetic material and the movable structure.

In addition, in another embodiment, a method may include magnetically adjusting a position of a ferromagnetic structure to alter a binary state of a memory device, and processing a command based on the binary state of the memory device. The memory device may be stackable on other memory devices having similar properties, and/or electrically coupled with other memory devices having similar properties in a memory array. Also, the method may be in a form of a machine-readable medium embodying a set of instructions that, when executed by a machine, cause the machine to perform any method disclosed herein.

Example embodiments of a method and a system, as described below, may be used to provide a high density, high speed, and low power electro-magnetic storage device. It will be appreciated that the various embodiments discussed herein may/may not be the same embodiment, and may be grouped into various other embodiments not explicitly disclosed herein.

Figure 1:
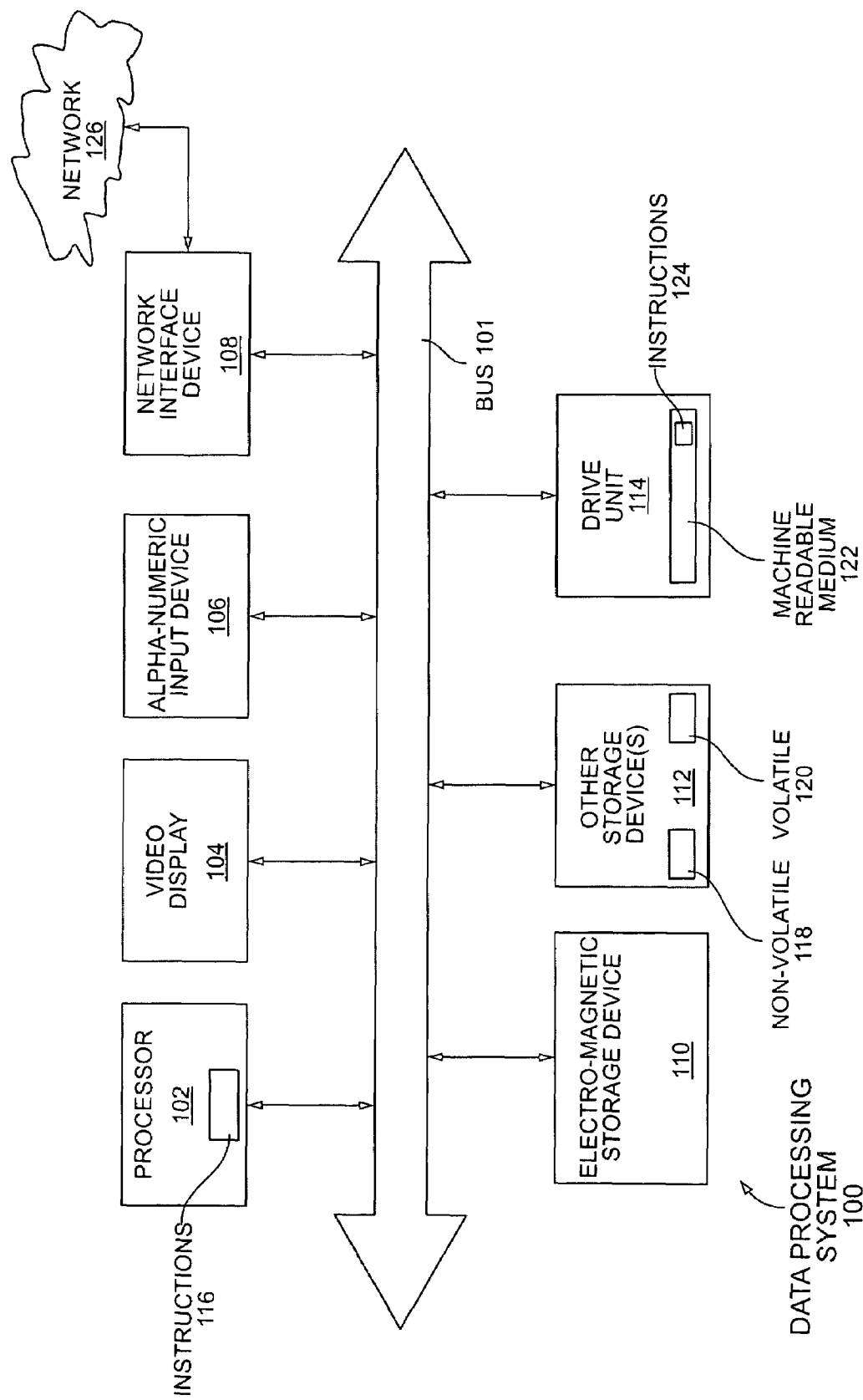
FIG. 1 is a diagrammatic representation of an electro-magnetic storage device associated with a data processing system capable of processing a set of instructions to perform any one or more of the methodologies herein, according to one embodiment.

FIG. 1 is a diagrammatic representation of an electro-magnetic storage device 110 associated with a data processing system 100 capable of processing a set of instructions to perform any one or more of the methodologies herein, according to one embodiment. In FIG. 1, the data processing system 100 (e.g., a laptop computer, a desktop computer, etc.) includes a bus 101 that enables communication between the electro-magnetic storage device 110 and a processor 102, a video display 104, an alpha-numeric input device 106, a network 126 accessible through a network interface device 108, other storage device(s) 112, and a drive unit 114.

The processor 102 (e. g. a microprocessor, a microcontroller, a graphics processor, a digital signal processor, a complex instruction set computing (CISC) microprocessor, a reduced instruction set computing (RISC) microprocessor, a very long instruction word (VLIW) microprocessor, explicitly parallel instruction computing (EPIC) microprocessor, etc.) includes instructions 116 (e.g., machine-readable and/or machine accessible instructions) which may be used to execute any of the methods and/or operations described herein.

The other storage device(s) 112 may be read only memory (ROM), random access memory (RAM), erasable programmable read only memory (EPROM), electrically erasable programmable read only memory (EEPROM), hard drive, removable media drive for handling compact disks (CDs), digital video disks (DVDs), diskettes, magnetic tape cartridges, memory cards, etc. Illustrated in FIG. 1, the other storage device(s) 112 may be non-volatile 118 (e.g., capable of retaining information without power) and/or volatile 120 (not capable of retaining information without power).

The drive unit 114 may include a machine readable medium 122 embodying a set of instructions 124, which, on execution, may perform any of the methods in the various embodiments described herein. The electro-magnetic storage device 110 may be less than 0.1 micron by 0.1 micron in size (e.g., to enable high density embodiments). In addition, in one embodiment, the electro-magnetic storage device 110 may have a mean-time between failure of at least 10 years.

Figure 2A:
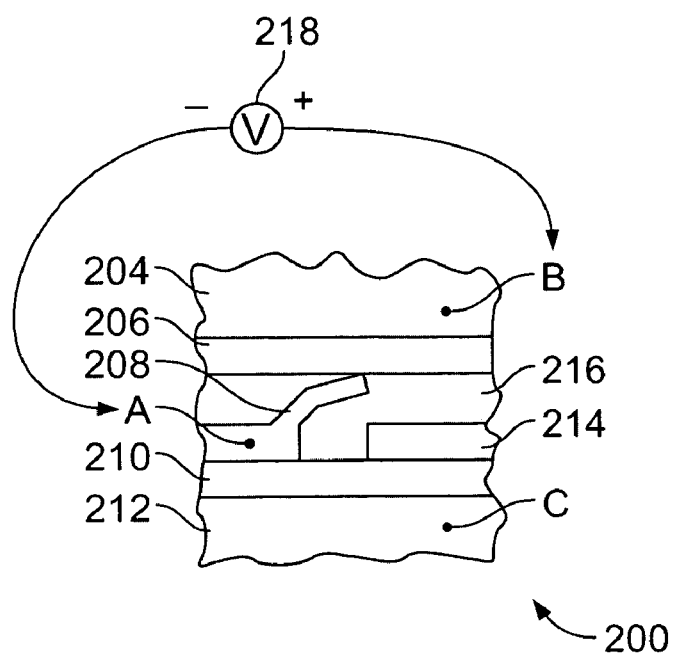
FIG. 2A-2B are cross-sectional views of the electro-magnetic storage device in two states, according to one embodiment.
Figure 2B:
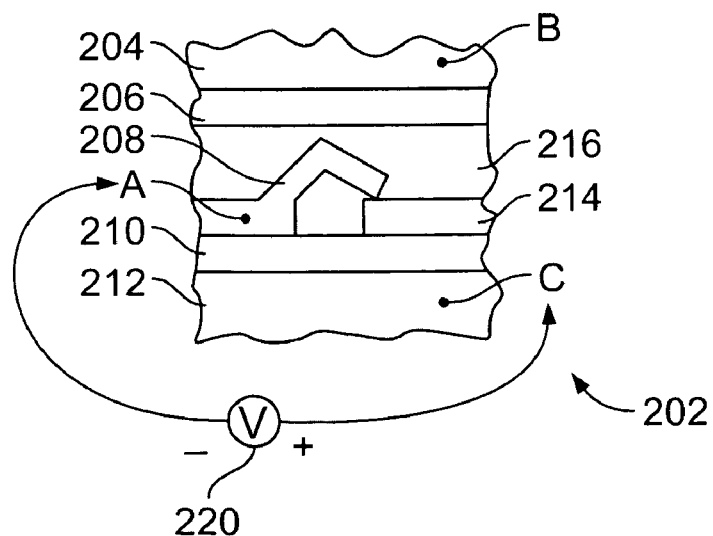

An example of the electro-magnetic storage device 110 is described in more detail with reference to FIG. 2A and FIG. 2B. FIG. 2A is a cross-sectional view 200 of an electro-magnetic storage device (e.g., the electro-magnetic storage device 110 of FIG. 1) in a first state (illustrated by a movable arm 208 coupled to a dielectric layer 206). FIG. 2B is a cross-sectional view 202 of the electro-magnetic storage device (e.g., the electro-magnetic storage device 110 of FIG. 1) in a second state (illustrated by a movable arm 208 detached from the dielectric layer 206, and coupled to the metal layer 214).

FIG. 2A illustrates a first magnetic layer 204, a first dielectric layer 206, a metal layer 214 patterned to include a movable arm 208, a second dielectric layer 210, and a second magnetic layer 212. FIG. 2A also illustrates a vacuum 216 (e.g., a vacuum chamber and/or a vacuum gap, etc.) encompassing the movable arm 208. In one embodiment, the vacuum 216 is approximately 3000-6000 Å (Angstroms) in height. The first magnetic layer 204 (e.g., a magnetic material) and the second magnetic layer 212 (e.g., also made from the magnetic material) may be approximately 50 to 100 Å in thickness (e.g., for optimal operation of the electro-magnetic storage device 110 of FIG. 1)

The first dielectric film 206 and/or the second dielectric film 210 may be between 10 to 20 Å in thickness in one embodiment for optimal operation and to achieve a speed faster than 5 nanoseconds of the electro-magnetic storage device (e.g., the electro-magnetic storage device 110 of FIG. 1). There are three nodes (e.g., metal connection points on various magnetic and or metal layers) illustrated in FIG. 2A, a node "A", a node "B", and a node "C." When a first voltage 218 is applied between the movable arm 208 (e.g., the node "A") and the first magnetic layer 204 (e.g., node "B"), the movable arm 208 moves upward toward the first magnetic layer 204 and attaches to the dielectric layer 206 (e.g., because of magnetic force).

The movable arm 208 may be a ferromagnetic material created from at least one or more of iron, cobalt, nickel, and/or gadolinium. In addition, the movable arm 208 may have a thickness between 5-20 nanometers and a tensile strength of at least 100 mega-pascals (MPa). Once the first voltage 218 has been applied, the movable arm 208 may stay connected to the dielectric layer 206 because of an electro-static force (e.g., the electrostatic force may be greater than a magnetic strength of the first magnetic layer 204), as illustrated in FIG. 2A.

Similar to FIG. 2A, FIG. 2B also illustrates the first magnetic layer 204, the first dielectric layer 206, the metal layer 214 patterned to include the movable arm 208, the second dielectric layer 210, and the second magnetic layer 212. However, in contrast to FIG. 2A, a second voltage 220 is applied in FIG. 2B between the node "A" and the node "C". The second voltage 220 may create a force stronger than the electrostatic force holding the movable arm 208 to the first dielectric layer 206 in FIG. 2A, and thereby cause the movable arm 208 to detach from the first dielectric layer 206 and to attach to the metal layer 214 as illustrated in FIG. 2B (e.g., and create a closed circuit of the metal layer 214). In one embodiment, the movable arm 208 only detaches from the first dielectric film 206 when the second voltage 220 is applied between the second magnetic material (e.g., the node "C") and the movable structure (e.g., the node "A"). In another embodiment, the magnetic strength of the first magnetic material 204 and the second magnetic material 212 may be the same for optimal performance.

Figure 3A:
FIGS. 3A-3N are process diagrams illustrating fabrication of the electro-magnetic storage device having a movable structure, according to one embodiment.
Figure 3B:
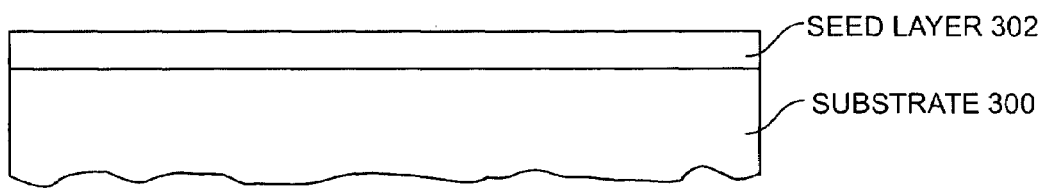
Figure 3C:
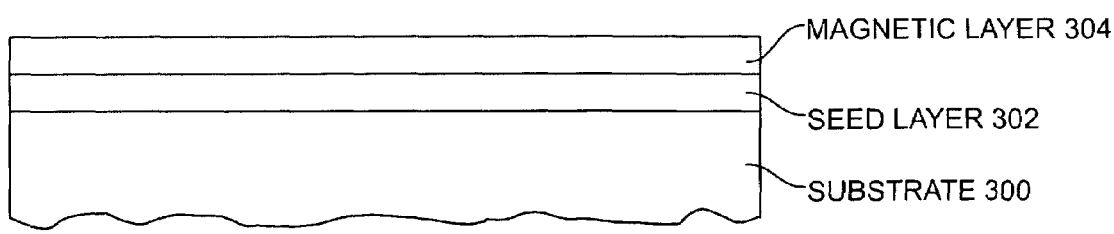
Figure 3D:
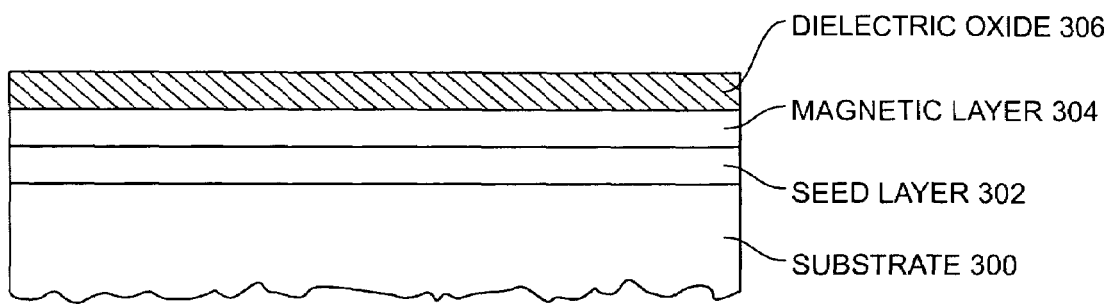
Figure 3E:
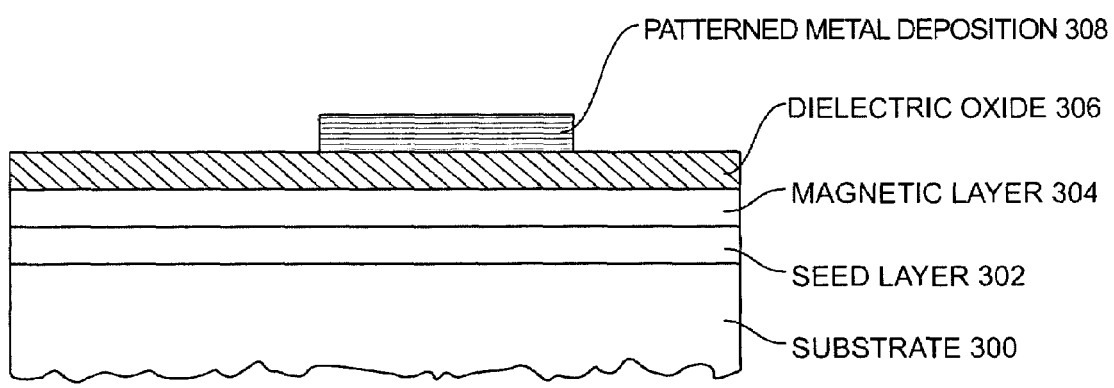
Figure 3F:
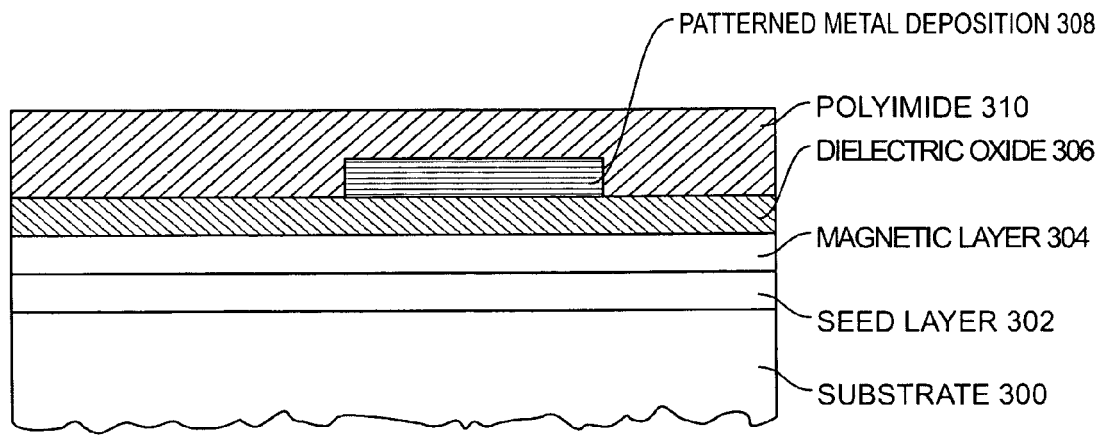
Figure 3G:
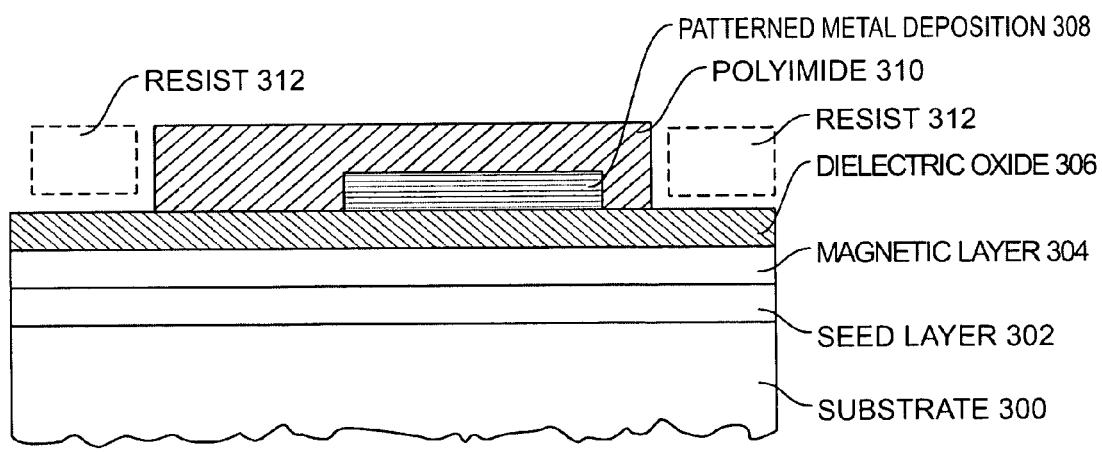
Figure 3H:
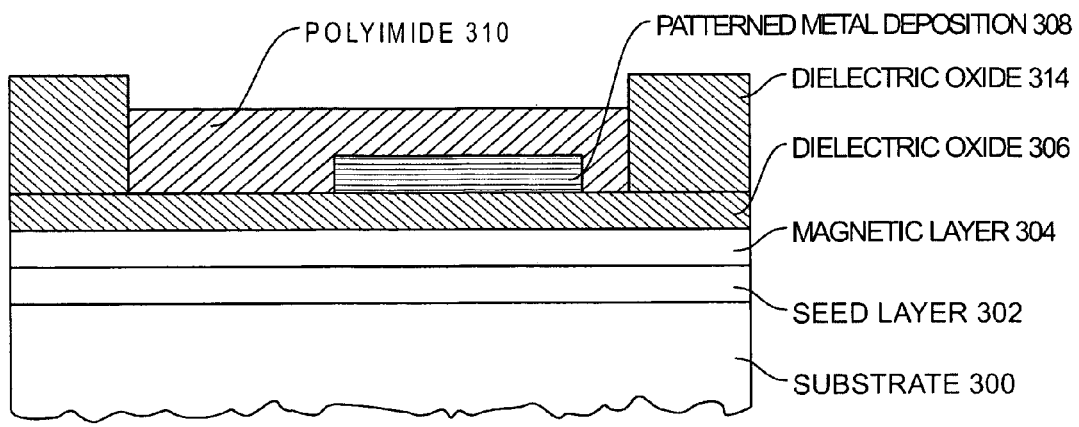
Figure 3I:
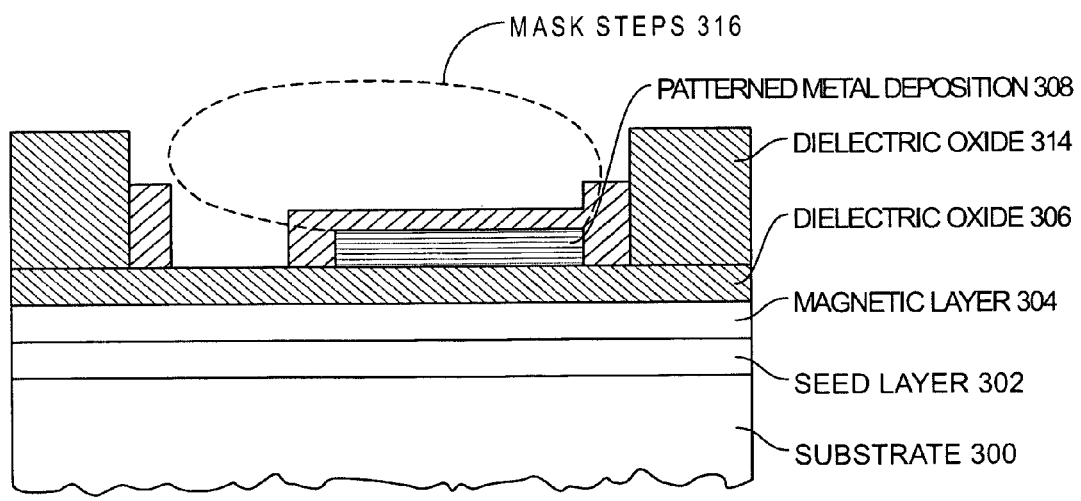
Figure 3J:
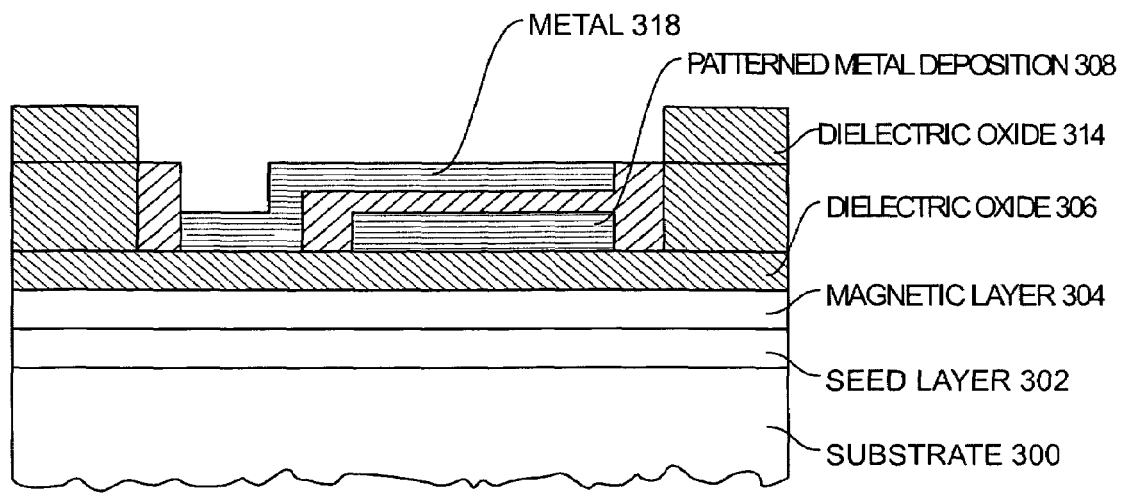
Figure 3K:
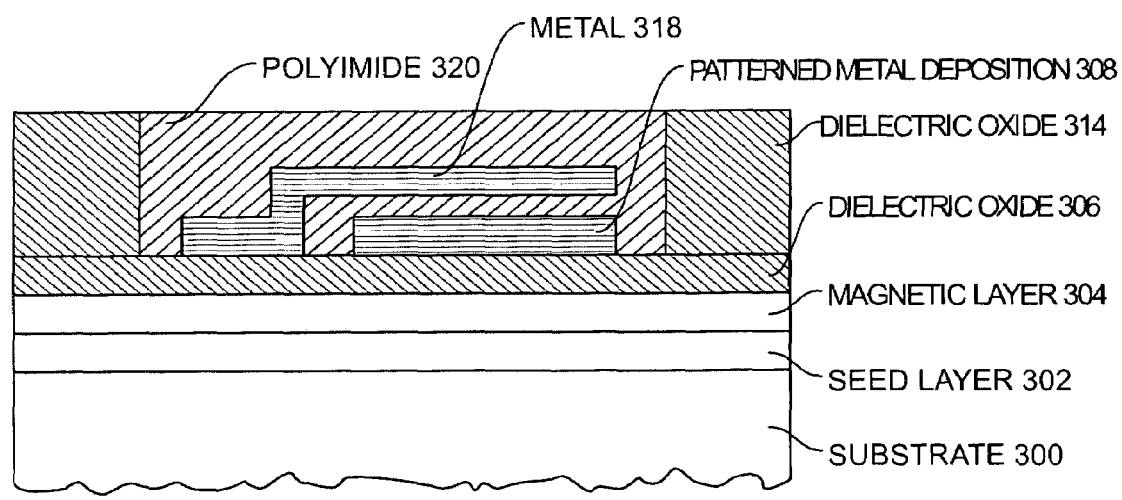
Figure 3L:
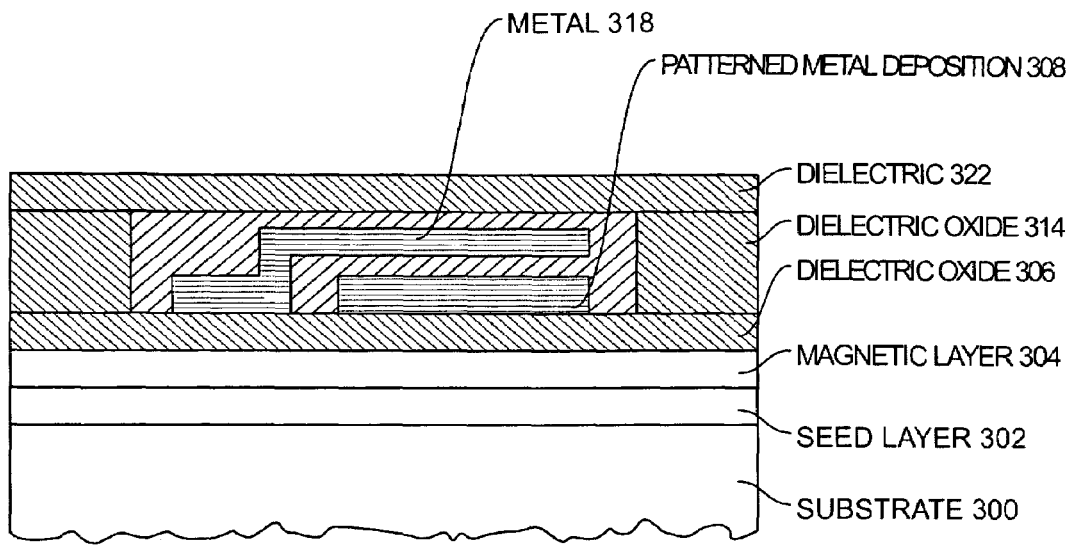
Figure 3M:
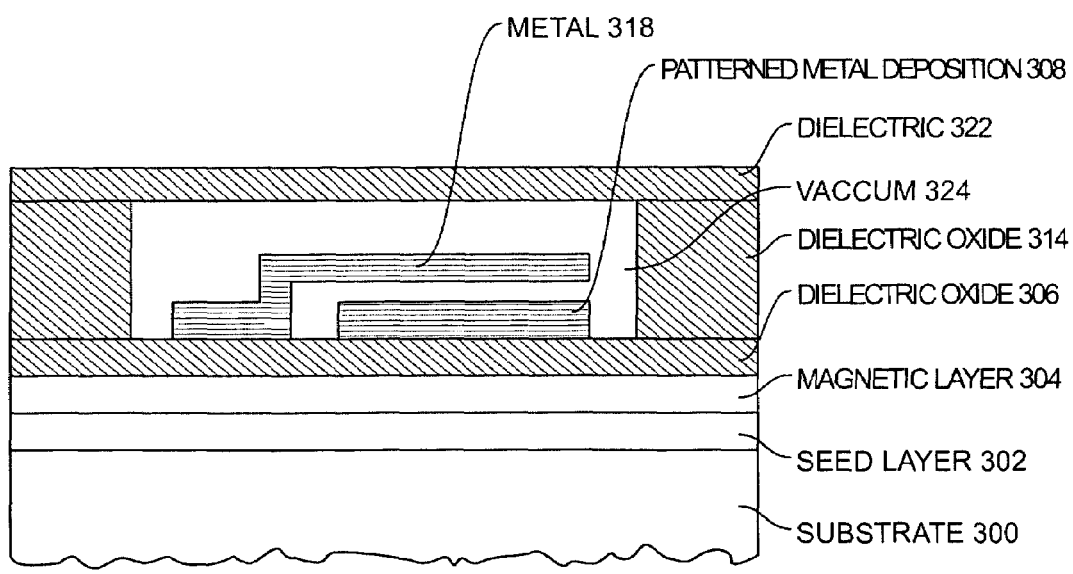
Figure 3N:
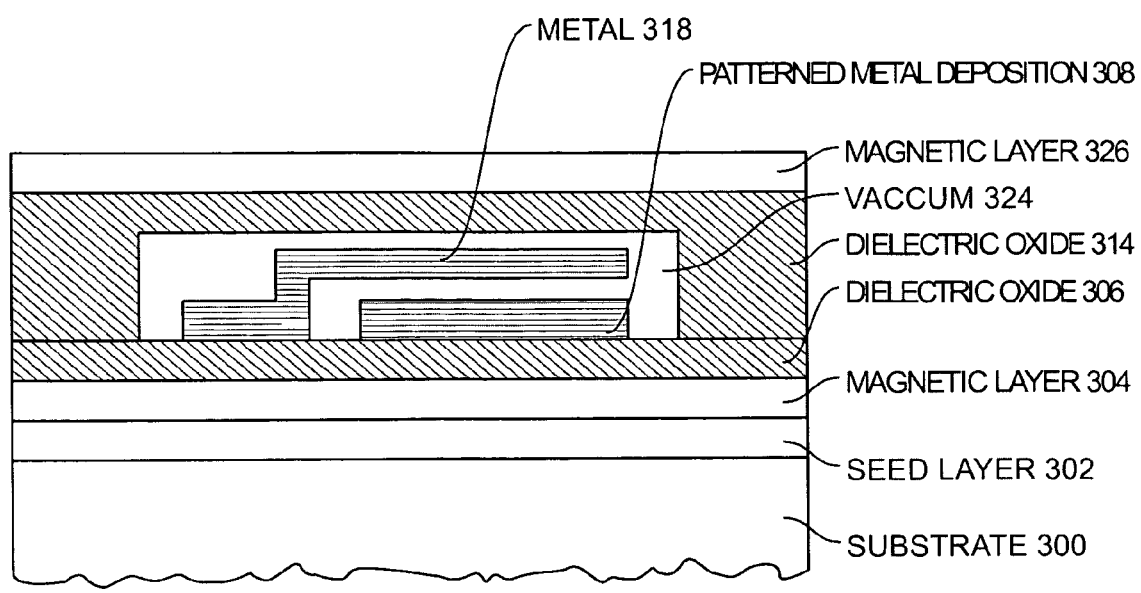

FIGS. 3A-3N are process diagrams illustrating fabrication of an electro-magnetic storage device (e.g., the electro-magnetic storage device 110 of FIG. 1) having a movable structure (e.g., the movable arm 208), according to one embodiment. First, FIG. 3A illustrates a substrate 300 (e.g., a semiconductor substrate, a silicon wafer, etc.). In FIG. 3B, a seed layer 302 (e.g., a dielectric layer of an initial oxide) is formed (e.g., grown) above the substrate 300 (e.g., to provide adhesiveness to a magnetic layer 304 that will later be deposited). In one embodiment, the seed layer 302 is approximately 100 Å in thickness for optimal performance.

Next, in FIG. 3C, the magnetic layer 304 is deposited on the seed layer 302. In one embodiment, the magnetic layer 304 is between approximately 50 to 100 Å (Angstroms) in thickness for optimal performance of an electro-magnetic storage device (e.g., the electro-magnetic storage device 110 of FIG. 1). Then, in FIG. 3D, a dielectric oxide 306 is deposited on the magnetic layer 304. In one embodiment, the dielectric oxide 306 is between 10 and 20 Å in thickness. Then, in FIG. 3E, a patterned metal deposition 308 is formed. In one embodiment, the patterned metal deposition 308 is formed through one or more photomasks (e.g., a transparent fused quartz blank imprinted with a pattern defined with chrome metal). The one or more photomasks may be used so that transparence may be limited to certain wavelengths of the electro-magnetic radiation (e.g., photomasks, each defining a pattern layer in integrated circuit fabrication, may be fed into a photolithography stepper or scanner and individually selected for exposure to create the patterned metal deposition 308).

Next, in FIG. 3F, a polyimide 310 is deposited above the patterned metal deposition 308. In one embodiment, the polyimide 310 (e.g., a polymer of imide monomers) is a linear polyimide made by combining imides into long chains. In another embodiment, the polyimide 310 is an aromatic heterocyclic polyimide, where R' and R" are two carbon atoms of an aromatic ring. Next, illustrated in FIG. 3G, portions of the polyimide 310 are exposed and a resist is developed in regions 312. Then, a dielectric oxide 314 (e.g., the dielectric oxide 306) is deposited in the regions 312 (e.g., using low-pressure chemical vapor deposition). As illustrated in FIG. 3H, the dielectric oxide 314 is patterned to be above the polyimide 310 (e.g., through at least one mask step).

Then, portions of the polyimide 310 are exposed using mask steps 316 to create a cavity in the polyimide 310 in FIG. 3I. Next, in FIG. 3J, a metal 318 (e.g., a ferromagnetic metal) is deposited in the cavity in the polyimide 310 as illustrated in FIG. 3J. In one embodiment, the metal 318 is at least one or more of iron, cobalt, nickel, and gadolinium and in the metal 318 is between 5-20 nanometers in thickness having a tensile strength of at least 100 mega-pascals (MPa). Then, in FIG. 3K, additional polyimide 320 (e.g., may be the same material as polyimide 308) is deposited above the metal 318. Then, in FIG. 3L, a dielectric 322 (e.g., may be the same material as the dielectric 306) is deposited above the additional polyimide 320 to enclose the metal 318 and the polyimide 320. Next, in FIG. 3M, a vacuum 324 (e.g., a vacuum gap, a vacuum chamber, etc.) may be formed using an oxygen-plasma etch technique. Then, in FIG. 3N, another magnetic layer 326 is deposited above the dielectric 322.

It should be noted that chemical vapor deposition (CVD) may be used to deposit thin films of various materials comprising the layers described in FIGS. 3A-3N (e.g., exposing a layer to one or more volatile precursors, which react and/or decompose on the layer surface to produce the desired deposit). In addition, processes to remove volatile byproducts may also be used (e.g., removed by gas flow through the reaction chamber).

In one embodiment, low-pressure CVD (LPCVD) processes are used in the various depositing operations in FIGS. 3A-3N at sub-atmospheric pressures (e.g., because reduced pressures may reduce unwanted gas phase reactions and improve film uniformity across the wafer) for optimal performance. Furthermore, in another embodiment, sputtering techniques are used to grow and/or deposit various layers illustrated in FIGS. 3A-3N (e.g., a physical process in which atoms in a solid target material are ejected into the gas phase due to bombardment of the material by energetic ions).

Figure 4:
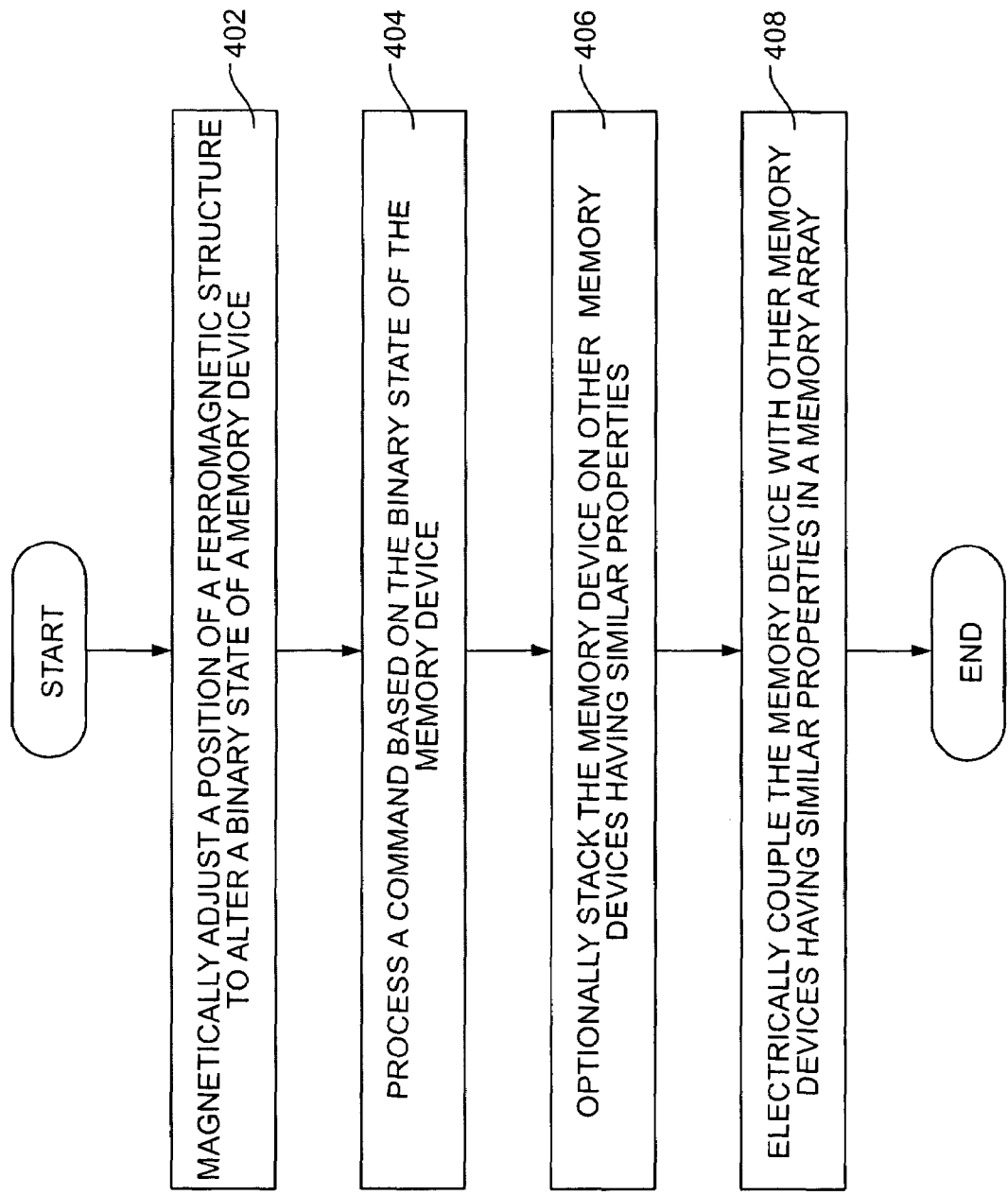
FIG. 4 is a flow chart illustrating the magnetic position adjustment of a ferromagnetic structure to alter a binary state of a memory device, according to one embodiment.

FIG. 4 is a flow chart illustrating the magnetic position adjustment of a ferromagnetic structure (e.g., the movable arm 208 of FIG. 2A and FIG. 2B) to alter a binary state of a memory device (e.g., the electro-magnetic memory device 110 of FIG. 1), according to one embodiment. In operation 402, a position of a ferromagnetic structure (e.g., the movable arm 208 of FIG. 2A and FIG. 2B may be magnetically adjusted (e.g., by applying voltages at various nodes as illustrated in FIG. 2A, FIG. 2B, and in FIG. 8) to alter a binary state of a memory device (e.g., the electro-magnetic memory device 110 of FIG. 1). In operation 404, a command (e.g., a read command, a write command, a seek command, a verify command, etc.) may be processed (e.g., analyzed using a processor such as the processor 102 illustrated in FIG. 1) based on the binary state (e.g., depending on the position of the movable arm 208 as illustrated in FIG. 2A and FIG. 2B of the memory device. In operation 406, the memory device may be optionally stacked (e.g., as described in FIG. 7) on other memory devices having similar properties (e.g., it should be noted that in some embodiments the memory device may be stacked on other devices not having similar properties as well). Then, in operation 408, the memory device may be electrically coupled with other memory devices having similar properties in a memory array (e.g., such as an array representation 600 as illustrated in FIG. 6).

Figure 5:
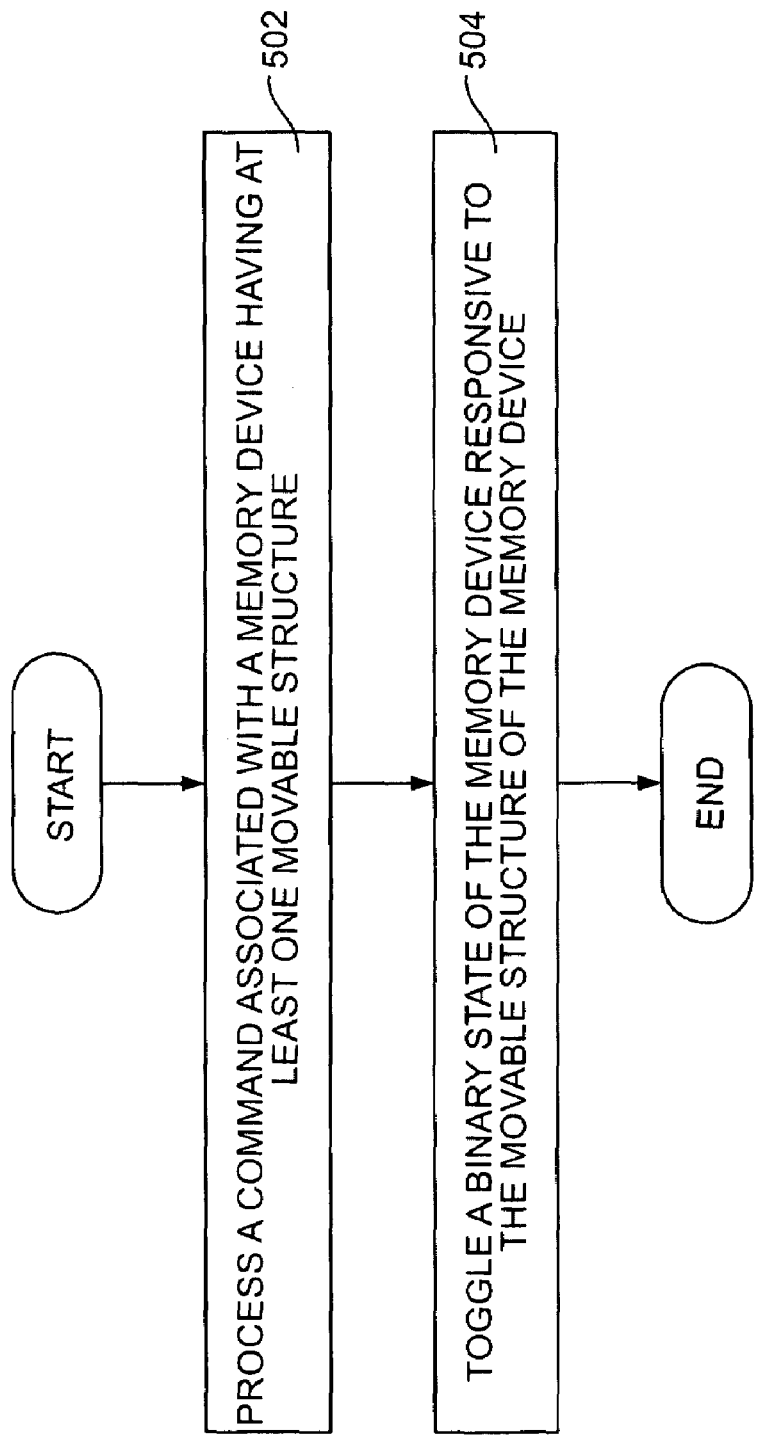
FIG. 5 is a flow chart illustrating the processing of a command associated with the memory device having at least one movable structure, according to one embodiment.

FIG. 5 is a flow chart illustrating the processing of a command associated with the memory device (e.g., the electromagnetic memory device 110 of FIG. 1) having at least one movable structure (e.g., the movable arm 208 of FIG. 2A and FIG. 2B), according to one embodiment. In one embodiment, the memory device may be stackable on other memory devices having similar properties, and the memory device may be electrically coupled with other memory devices having similar properties in a memory array (as illustrated in FIG. 6).

In operation 502, a command (e.g., a read, write, verify, etc. command) that is associated with a memory device having at least one movable structure may be processed (e.g., analyzed by a processor or data processing system, such as the data processing system 100 of FIG. 1). In operation 504, a binary state of the memory device may be toggled (e.g., by altering the binary state of the memory device by applying voltages as described in FIG. 2A and FIG. 2B of the memory device responsive to the movable structure (the movable arm 208 as described in FIG. 2A and FIG. 2B of the memory device.

Figure 6:
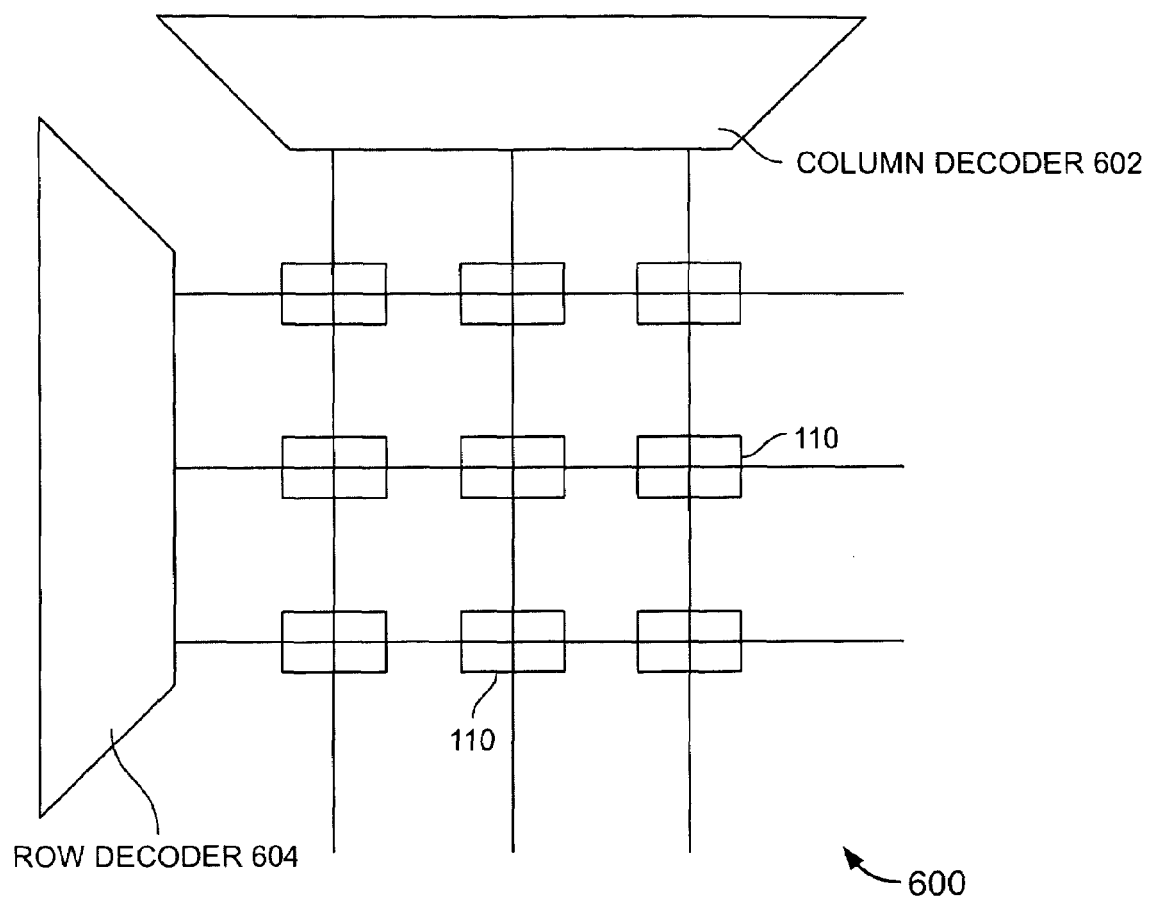
FIG. 6 is an array representation of the electro-magnetic storage device, according to one embodiment.

FIG. 6 is an array representation 600 of the electro-magnetic storage device 110 (e.g., as illustrated in FIG. 1), according to one embodiment. A column decoder 602 may used to decode various bits of data (e.g., stored in a column) associated with one or more of the electro-magnetic storage device 110. In addition, a row decoder 604 may used to decode various bits of data (e.g., stored in a row) associated with one or more of the electro-magnetic storage device 110.

Figure 7:
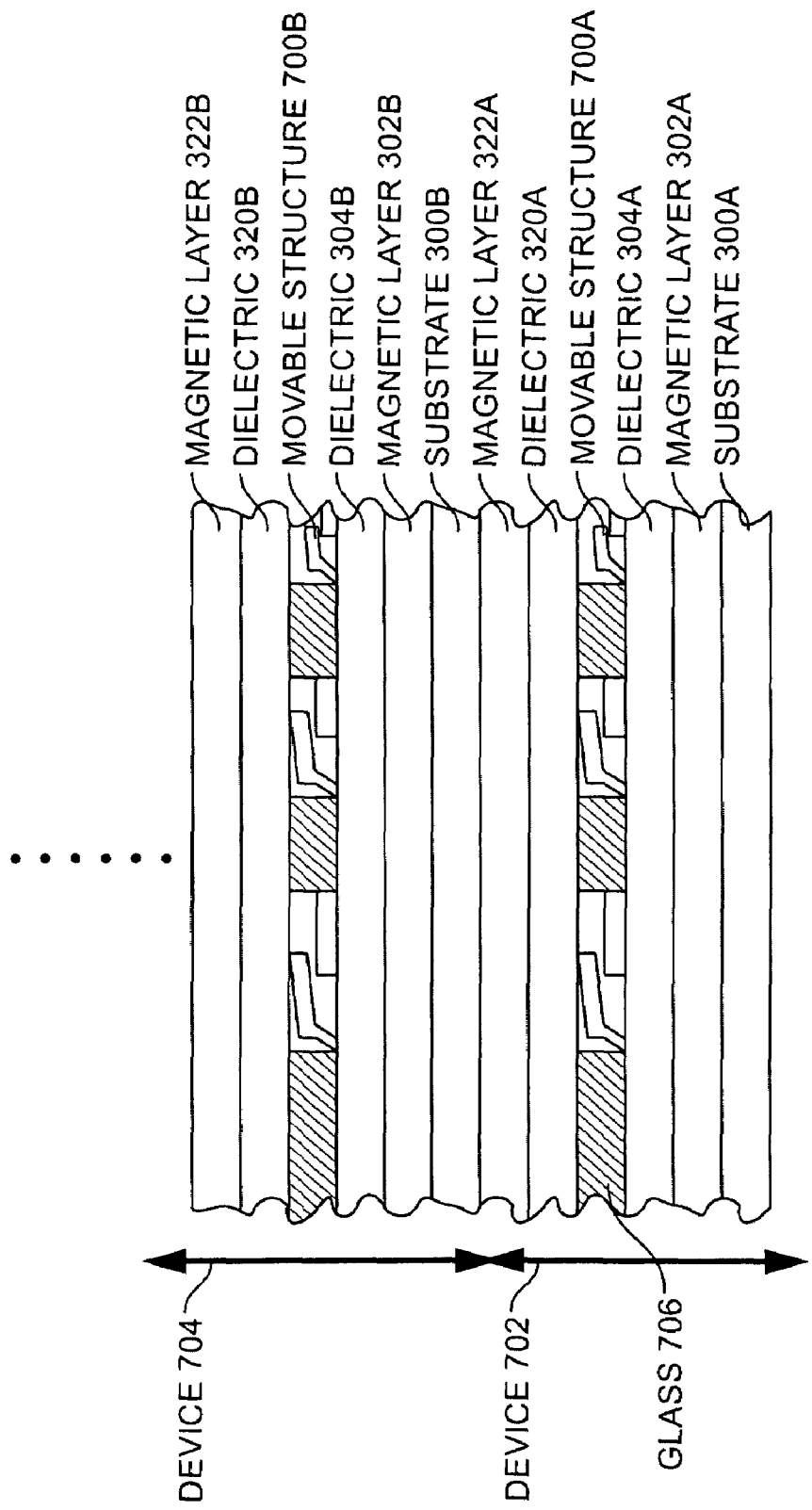
FIG. 7 is a cross-sectional view of a stacked array of the electro-magnetic storage device, according to one embodiment.

FIG. 7 is a cross-sectional view of a stacked array of the electro-magnetic storage device, according to one embodiment. There are two devices (e.g., the electro-magnetic storage device 110) illustrated in FIG. 7. The first device 702 includes a substrate 300A, a magnetic layer 302A, a dielectric layer 304A, a movable structure 700A, a dielectric layer 320A, and a magnetic layer 322A. The second device 704 includes a substrate 300B, a magnetic layer 302B, a dielectric layer 304B, a movable structure 700B, a dielectric layer 320B, and a magnetic layer 322B. The first device 702 and the second 704 may be electrically coupled to each other through a series of interconnects, a metal interconnect, through wire-bonding, ball grid array techniques, or through any other device stacking technique as known in the art.

Each of the movable structures (e.g., the movable structure 300A and the movable structure 300B) is separated from other movable structures in one embodiment by a glass 706.

Figure 8:
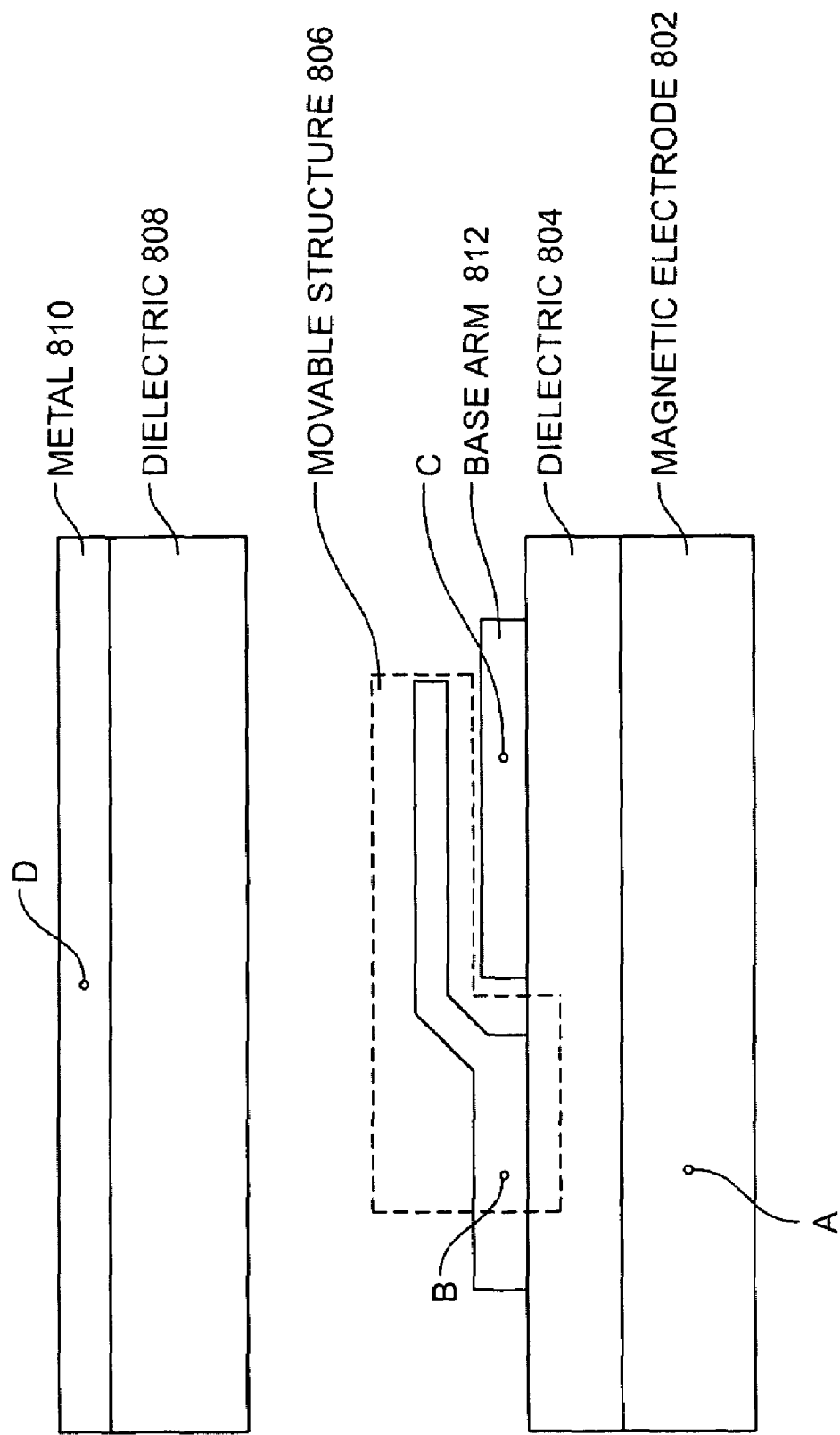
FIG. 8 is a cross sectional view of a single-magnetic layer electro-magnetic storage device, according to one embodiment.

FIG. 8 is a cross-sectional view of a single-magnetic layer electro-magnetic storage device, according to one embodiment. In FIG. 8, a magnetic electrode 802 (e.g., a magnetic layer), a dielectric layer 804, a movable structure 806, a dielectric 808, a metal layer 810, and a base arm 812 (e.g., a metal layer such as the metal layer 214 of FIG. 2A and FIG. 2B) is illustrated. In the embodiment illustrated in FIG. 8, there is only one magnetic electrode (e.g., the magnetic layer 802). The movable structure 806 in FIG. 8 may retract away from the base arm 812 merely because of a tensile strength of the metal (e.g., a ferromagnetic material as previously described) that makes up the movable structure 806 when a voltage is applied between a node 'B' of FIG. 8 (e.g., associated with a metal electrical connection area on the movable structure 806) and a node 'D' of FIG. 8 associated with an electrical connection point on metal layer 810, and the movable structure 806 may remain detached from the base arm 812, even after the voltage is removed.

In one embodiment illustrated in FIG. 8, the magnetic force from magnetic electrode (e.g., the magnetic electrode 802) is strong enough to hold the movable arm to the base terminal during any unwanted mechanical vibration caused by a short pulse (e.g. 1 Giga Hertz) or otherwise.

Although the present embodiments has been described with reference to specific example embodiments, it will be evident that various modifications and changes may be made to these embodiments without departing from the broader spirit and scope of the invention. For example, the electromagnetic device 110 described herein may be enabled and operated using hardware circuitry (e.g., CMOS based logic circuitry), firmware, software and/or any combination of hardware, firmware, and/or software (e.g., embodied in a machine readable medium).

For example, electro-magnetic storage device 110 may be enabled using transistors, logic gates, and electrical circuits (e.g., application specific integrated ASIC circuitry). In addition, it will be appreciated that the various operations, processes, and methods disclosed herein may be embodied in a machine-readable medium and/or a machine accessible medium compatible with a data processing system (e.g., a computer system), and may be performed in any order. Accordingly, the specification and drawings are to be regarded in an illustrative rather than a restrictive sense.

What is claimed is:

1. A memory device, comprising:
   a first magnetic material to attract a movable structure when a first voltage is applied between the first magnetic material and the movable structure; wherein when the first voltage is applied between the movable arm and the first magnetic layer, the movable arm moves upward toward the first magnetic layer and attaches to the dielectric layer because of electrostatic force, remains attached even after the removal of the voltage due to magnetic force; and
   a second magnetic material to release the movable structure when a second voltage is applied between the second magnetic material and the movable structure; wherein the second voltage may create a force stronger than the magnetic force holding the movable arm to the first dielectric layer, and thereby cause the movable arm to detach from the first dielectric layer and to attach to the metal layer, wherein the first magnetic material and the second magnetic material are between approximately 50 to 100 Å (Angstroms) in thickness, and wherein the memory device is faster than 5 nanoseconds in speed.

2. The memory device of claim 1 wherein the movable structure is a ferromagnetic material.

3. The memory device of claim 2 wherein the ferromagnetic material is at least one or more of iron, cobalt, nickel, and gadolinium and wherein the ferromagnetic material is between 5-20 nanometers in thickness having a tensile strength of at least 100 mega-pascals (MPa).

4. The memory device of claim 1 wherein there is a vacuum-gap between the movable structure and at least one of the first magnetic material and the second magnetic material.

5. The memory device of claim 1 wherein the movable arm creates a closed circuit when the second voltage is applied between the second magnetic material and the movable structure and releases to open circuit when the first voltage is applied between the first magnetic material and the movable structure.

6. The memory device of claim 1 wherein the movable arm attaches to a dielectric layer between the movable arm and the first magnetic material when the first voltage is applied between the first magnetic material and the movable structure.

7. The memory device of claim 6 wherein the movable arm only detaches from the dielectric layer when the second voltage is applied between the second magnetic material and the movable structure.

8. The memory device of claim 7 wherein the dielectric layer is between 10 to 20 Å (Angstroms) in thickness.

9. The memory device of claim 8 wherein the movable arm attaches or detaches through an electrostatic force that is created between either top magnetic layer and movable arm or bottom magnetic layer and movable arm when a voltage is applied.

10. The memory device of claim 9 wherein the electrostatic force is greater than a magnetic strength of the first magnetic material and the second magnetic material.

11. The memory device of claim 10 wherein the magnetic strength of the first magnetic material and the second magnetic material may be the same.

12. The memory device of claim 1 wherein the memory device is less than 0.1 micron by 0.1 micron in size, and wherein a mean-time between failure of the memory device is at least 10 years.

13. A system comprising:
 means for processing a command associated with a memory device having at least one movable structure; and
 means for toggling a binary state of the memory device responsive to the movable structure of the memory device, wherein the memory device comprises a first magnetic material and a second magnetic material of thickness approximately between 50 to 100 Å (Angstroms), and wherein the memory device is faster than 5 nanoseconds in speed.

14. The system of claim 13 wherein the movable structure is made of a ferromagnetic material and wherein the movable structure repositions through an electrostatic force when a voltage is applied between the movable structure and associated top and bottom magnetic electrodes.

15. A structure assembly, comprising:
 a first magnetic layer formed above a substrate;
 a first dielectric layer formed above the first magnetic layer;
 a set of one or more metal layers having at least one movable component that is encompassed by a vacuum gap and which is formed above the first dielectric layer;
 a second dielectric layer formed above the vacuum gap and above the set of one or more metal layers; and
 a second magnetic layer formed above the second dielectric layer, wherein the first magnetic material and the second magnetic material are between approximately 50 to 100 Å (Angstroms) in thickness, and wherein the memory device is faster than 5 nanoseconds in speed.

16. The structure assembly of claim 15 wherein each of the at least one movable component that is encompassed by the vacuum gap is separated by a dielectric barrier.

* * * * *